United States Patent [19]

Tracy

[11] 4,067,104
[45] Jan. 10, 1978

[54] METHOD OF FABRICATING AN ARRAY OF FLEXIBLE METALLIC INTERCONNECTS FOR COUPLING MICROELECTRONICS COMPONENTS

[75] Inventor: John M. Tracy, Thousand Oaks, Calif.

[73] Assignee: Rockwell International Corporation, El Segundo, Calif.

[21] Appl. No.: 771,730

[22] Filed: Feb. 24, 1977

[51] Int. Cl.² .......................... H05K 3/30; H05K 3/36
[52] U.S. Cl. ........................................ 29/626; 29/578; 29/591; 29/628; 361/412; 427/123; 427/264
[58] Field of Search .................. 29/591, 578, 626, 628; 174/68.5; 427/123, 264, 265, 352; 361/412, 414

[56] References Cited

U.S. PATENT DOCUMENTS

| | | | |
|---|---|---|---|
| 3,447,960 | 6/1969 | Tonozzi | 427/264 X |
| 3,795,037 | 3/1974 | Luttmer | 29/628 |
| 3,829,601 | 8/1974 | Jeannotte et al. | 29/628 X |
| 3,904,461 | 9/1975 | Estep et al. | 427/103 X |

Primary Examiner—Victor A. DiPalma
Attorney, Agent, or Firm—L. Lee Humphries; Craig O. Malin

[57] ABSTRACT

A method of interconnecting microelectronic components with flexible metallic interconnects. A layer of photoresist is applied to the surface of a microelectronic component and then removed from selected locations. A deposit of metal is applied to the selected location. A second layer of photoresist is applied over the first layer and over the deposited metal. The second layer of photoresist is removed from above the metal deposit and a second metal deposit is applied over the first metal deposit. These steps are repeated until a predetermined height of deposited metal is reached supported by layers of photoresist. The upper surface of the deposit and photoresist is polished flat and pads of metal deposited. A second microelectronic component having mating metal pads is positioned over the first microelectronic component and bonded to it through the mating metal pads. Finally, the layers of photoresist are removed.

12 Claims, 16 Drawing Figures

METHOD OF FABRICATING AN ARRAY OF FLEXIBLE METALLIC INTERCONNECTS FOR COUPLING MICROELECTRONICS COMPONENTS

BACKGROUND OF THE INVENTION

A. Field of the Invention

This invention relates to the field of microelectronics and more particularly to means for electrically and structurally interconnecting microelectronic components.

B. Description of the Prior Art

A problem is created when microelectronic devices made from different materials are interconnected and then exposed to variations in temperature. The difference in thermal expansion between the materials causes stresses to be created between the different components which can cause failure of the interconnection and degradation of component characteristics. Until the present invention, this problem has prevented the direct interconnection of planar (two dimensional), high density arrays of microelectronic components which are exposed to temperature variations and are made from materials having different thermal expansion.

A technique called flip-chip bonding of silicon chips or dice is known. According to this technique, thin pads, or bumps, of metal are deposited on one side of a silicon chip and an appropriate substrate with interconnecting circuitry. The chip is then "flipped" over on top of the substrate and corresponding pads on the chip and substrate are bonded together. The resulting interconnections are not flexible and will rupture if exposed to thermal stresses. However, if both chip and substrate are made from materials having the same thermal expansion coefficient, significant thermal stresses are not created in the joint.

In some applications, it is necessary to join microelectronic components made from two different materials having different thermal expansion coefficients. For example, focal planes used for the detection of radiation require arrays of photodiodes which are constructed of special semiconducting alloy compounds such as PbSnTe. The output from these photodiodes must then be coupled to signal receiving and processing circuits which utilize highly developed silicon integrated circuit technology. However, there is a large thermal mismatch (approximately $18 \times 10^{-6}/°K$) between silicon and PbSnTe. If a large array of PbSnTe photodiodes are directly bonded to a silicon chip utilizing prior flip-chip bonding, the thermal stresses created by temperature changes either during the processing of the chip or during its application will cause failure of many of the bonds.

According to the prior art, linear arrays of photodiodes have been supported upon circuit boards and connected by long leads to processing circuits. Such prior art indirect mating is suitable only for linear arrays and cannot provide a high density planar array of sensors directly coupled to a receiver, such as provided by the present invention.

SUMMARY OF THE INVENTION

It is an object of the invention to provide an improved method of interconnecting arrays of microelectronic elements.

It is an object of the invention to provide a flexible interconnect for coupling electronic elements of microelectronic components made from materials having different coefficients of expansion.

It is an object of the invention to provide an interconnect for electrically coupling and structurally supporting a microelectronic component in juxtaposition to another microelectronic component.

It is an object of the invention to provide a two-dimensional array of sensors directly coupled both electrically and structurally to a juxtapositioned signal processor by means of a plurality of columns.

According to the invention, a method is provided for interconnecting microelectronic components with flexible metallic interconnects. A layer of photoresist is applied to the surface of a microelectronic component and then removed from selected locations. A deposit of metal is applied to the selected location. A second layer of photoresist is applied over the first layer and over the deposited metal. The second layer of photoresist is removed from above the metal deposit and a second metal deposit is applied over the first metal deposit. These steps are repeated until a predetermined height of deposited metal is reached supported by layers of photoresist. The upper surface of the deposit and photoresist is polished flat and pads of metal deposited. A second microelectronic component having mating metal pads is positioned over the first microelectronic component and bonded to it through the mating metal pads. Finally, the layers of photoresist are removed.

These and other objects and features of the present invention will be apparent from the following detailed description, taken with reference to the accompanying drawings.

DESCRIPTION OF THE PREFERRED EMBODIMENT

A device which can be produced according to the method of the invention is disclosed by co-inventors J. M. Tracy (inventor of) the present invention) and J. T. Longo in patent application Ser. No. 771,599 filed concurrently with the present invention.

Figure 1:
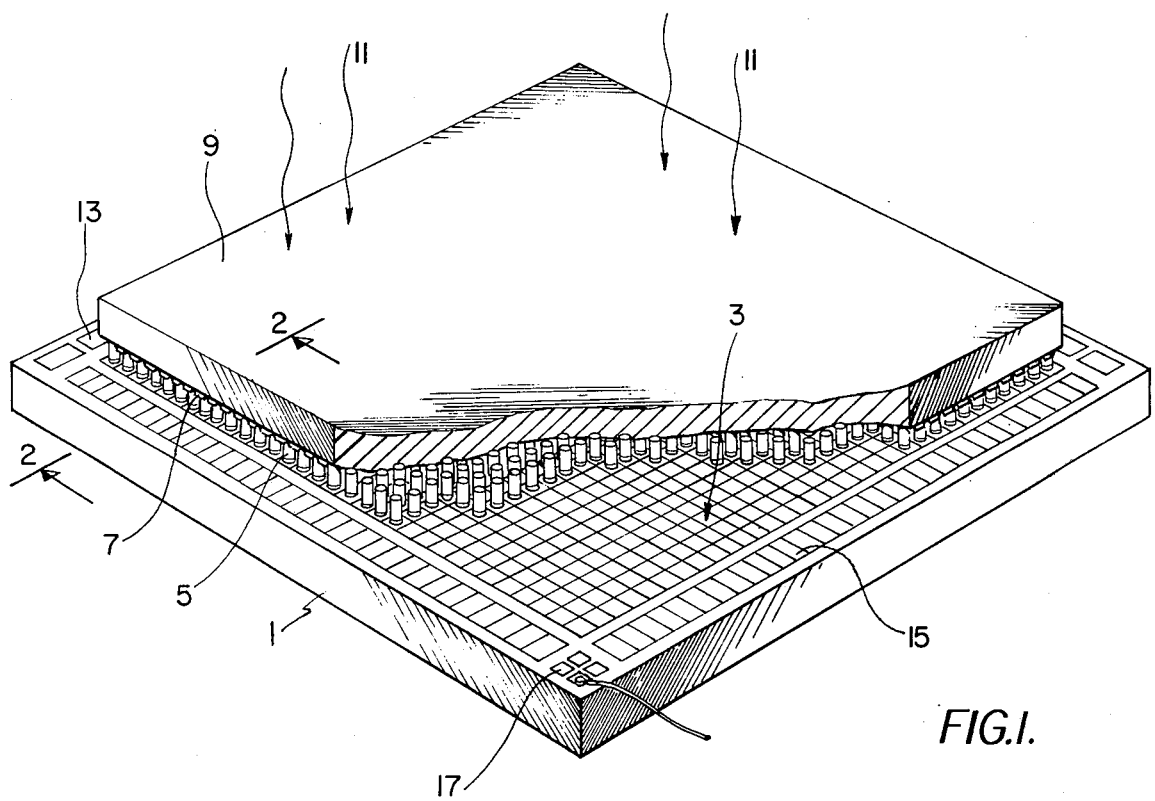
FIG. 1 is a greatly enlarged perspective view of two microelectronic components interconnected according to the invention.

FIG. 1 is a greatly enlarged view of a microelectronic component 1 having an array of separate electronic elements 3 on one surface. A plurality of conductive columns 5 extend outwardly from each electronic element 3 to a corresponding array of separate electronic element 7 on a second microelectronic component 9. The columns 5 provide electrical coupling between the electronic elements 3, 7 on the two microelectronic components, and also provide the sole structural support of microelectronic component 9 in its juxtaposition above microelectronic component 1.

The term microelectronic component and microelectronic element encompass a broad field of electronic and electrical devices including passive devices such as electrodes, capacitors, resistors, and inductors; and active devices such as semiconductors, radiation sensors, piezoelectrics, charge coupled devices (CCDs), and combinations of these and other electronic and electrical devices.

In a preferred embodiment, microelectronic component 1 is a silicon signal processor chip or multiplexer and its electronic elements 3 are FET switches arranged in a two-dimensional array. Such multiplexers are well known in the art. The conductive columns 5 are indium conductors which connect the sources on the FET switches 3 to backside illuminated photodiodes (elements 7) arranged in a two-dimensional array on the backside of a detector chip (second microelectronic component 9). Incident radiation 11 striking the detector chip create charges, or signals, in each photodiode array which are processed in chip 1 and read out through appropriate signal pads 13, 15, 17.

Figure 2:
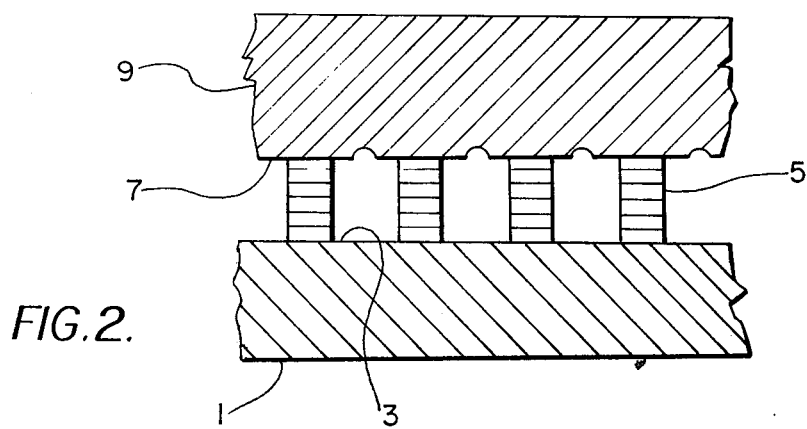
FIG. 2 is a partial cross-section of FIG. 1 taken at location 2—2.

FIG. 2 is an enlarged, partial section of the assembly showing the columns 5 joining the array of FET switches 3 on silicon chip 1 to a corresponding array of backside illuminated photodiodes 7 on detector chip 9. The FET switches 3 are fabricated on silicon chip 1 in a known manner. The photodiodes are p-n type junctions forming isolated mesas on the backside of detector chip 9. In the embodiment of the invention, shown in FIG. 2, the columns 5 comprise separate layers of a metal such as indium built up in individual layers in a novel manner as described later in the specification.

The structures shown in FIGS. 1 and 2 are suitable for directly bonding microelectronic components made from a wide variety of materials. Photodetector chips made from PbSnTe and from InAsSb have been coupled to silicon chips. Each chip has 1024 separate photodiodes arranged in 32×32 arrays and are connected by indium columns whose centers are spaced 4 mils apart. The columns have a diameter of approximately 1 mil and a length of 1.7 mil, giving them an aspect ratio, R, of 1.7.

The mismatches in the coefficient of thermal expansion between the silicon chip and the PbSnTe and InAsSb photodetector are approximately $18 \times 10^{-6}/°K$ and $4 \times 10^{-6}/°K$, respectively. If large arrays of such materials were coupled by the prior flip-chip bonding technique, they could not be exposed to significant temperature changes without degradation and/or joint separation. However, when coupled as shown in FIGS. 1 and 2, the arrays with stand processing at 300° K and operation at 4° to 195° K.

Figure 3A:
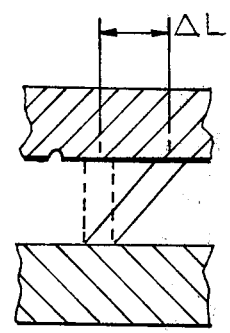
FIGS. 3 and 3a are schematic representations of the effect of temperature changes on a central row of interconnects.
Figure 3:
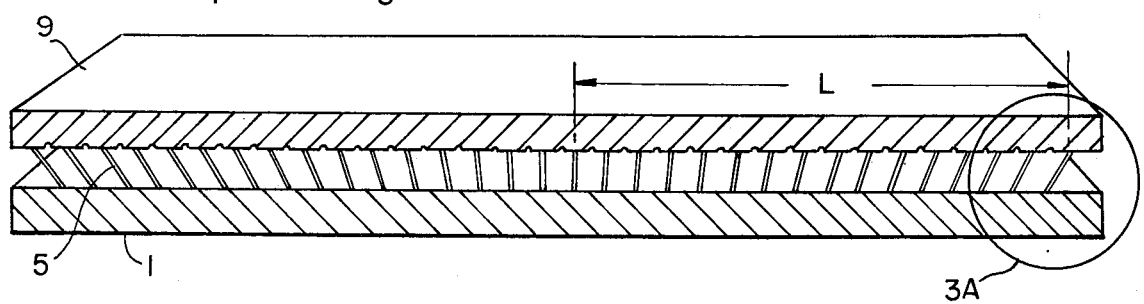

FIG. 3 shows the effect of temperature upon interconnections between two components having different coefficients of expansion. The cross-section shown is taken through a center row of interconnectors 5 and the top component 9 is assumed to have a smaller coefficient of expansion than the bottom component 1. If the assembly is then cooled down from the fabrication temperature of 300° K to the operating temperature of 30° K, the lower component 1 will shrink faster than the top component 9. As a result, those columns outward of the center column will be pulled inward at their base. The length of displacements, $\Delta l$, of the base of the column from vertical is:

$$\Delta l = L \Delta T \Delta C;$$

where:

L equals the distance of the column from the center;
$\Delta T$ equals the change in temperature; and
$\Delta C$ equals the difference in coefficient of thermal expansion between the two components.

The force imposed upon columns 5 by the displacement, $\Delta l$, of the column in the elastic range is given by the formula:

$$F = \Delta l E \, d(d/h)^3$$

where:

$F$ equals the force applied to the column;
$\Delta l$ equals the displacement of the column;
$E$ equals modulous of elasticity of the column;
$d$ equals the diameter of the column;
$h$ equals the height of the column; and
$h/d$ equals the aspect ratio, R, of the column.

To prevent failure or yielding of the column or its junction with the components in either shear or tension, the aspect ratio, R, of the column must exceed:

$$R = (\Delta l \, E \, d/F)^{1/3}$$

where $F$ equals the force required to cause failure or yielding of the column or its junction. This relationship is applicable for materials in which failure occurs in the junction or in the column before yielding of the column.

For columns made of ductile material having high bond strength, yielding of the columns can occur without rupturing the interconnections. Four such plastic combinations, the relationship between displacement, $\Delta l$, and a critical breaking force, $F_c$, is ideally defined by:

$$\Delta l = h(F_c/AK)^{1/n}.$$

If a cylindrical column is assumed, the minimum aspect ratio becomes:

$$R = (\pi K)^2 \Delta l(r^3/F_c^2)$$

where:

$h$ equals the height of the column;
$F_c$ equals the critical breaking force;
$A$ equals the area of the column
$K$ equals a constant related to the yield strength of the column of material; and
$n$ equals the work hardening exponent of the column material which is approximately equal to ½ for most metals.

The above theoretical approximations show that the minimum aspect ratio, R, increases directly with: (1) the size of the array, (2) the temperature difference, and (3) the mismatch in the thermal coefficient of expansion. Other considerations, such as column metal grain size make exact calculation of minimum aspect ratio extremely difficult. However, a practical approach to designing a particular interconnect is simply to construct interconnects having various aspect ratios and then test them under operating conditions until a minimum, reliable aspect ratio is established. As noted for the example of a PbSnTe photodetector bonded to silicon using indium, an aspect ratio of 2.0 was satisfactory, while an aspect ratio of 1.3 was unsatisfactory for a 270° K temperature change. For other combinations and requirements, the aspect ratio can be increased or decreased directly as the above mentioned three variables are changed.

Fabrication of the interconnecting columns requires precise positioning of many very small columns between the elements being joined. Until the present invention, such small precisely located columns could not be fabricated with aspect ratios greater than about 1. However, according to a preferred method of practicing the present invention, columns of any required aspect ratio can be precisely positioned between two microelectronic components.

Figure 4:
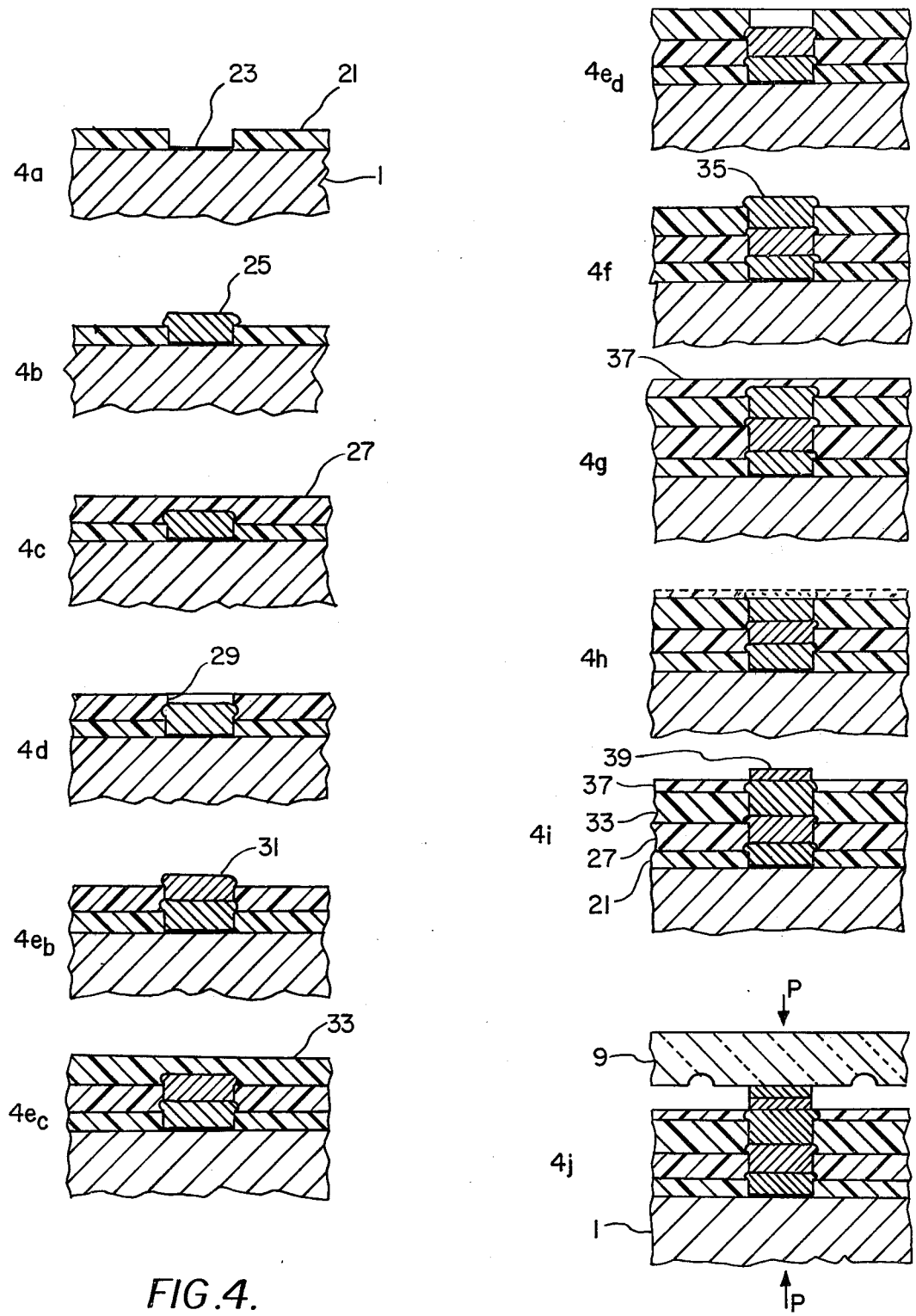
FIGS. 4a–4j are partial cross-sections taken through a column at various stages during the method of fabricating the interconnect.

As shown in FIG. 4a, one of the microelectronic components 1 is covered with a photoresist material 21 except for the contact locations 23 in a known manner (see, for example, U.S. Pat. No. 3,520,683 to R. E. Kerwin). A deposit of metal 25 is then electroplated upon the contact. The height of the deposit of metal 25 is limited by the fact that it begins to balloon out when it extends above the photoresist 21 as shown in FIG. 4b. A second coat of photoresist 27 is then applied over the assembly and an opening 29 provided on the top of deposit 25 as shown in FIGS. 4c and 4d. The openings in the photoresist can be precisely located by well known photographic and photoresist dissolving techniques. Since the metal deposits fill the openings to form the columns, the resulting columns are also precisely located.

The above described process of filling the opening with a deposit of metal 25, 31 and then providing layers of photoresist 27, 33 is repeated as shown in FIGS. $4e_b$-$4e_d$ until a predetermined height of metal is built up. A top deposit 35 of metal is then plated on top of the last deposit and coated with photoresist 37 as shown in FIGS. 4f and 4g. The top layer of photoresist 37 is then removed (for example, by grinding or polishing) flush to the metal column as shown in FIG. 4h, and a thin deposit of metal 39 is plated or vapor deposited up the top of each column.

The final product of the above steps is a microelectronic component 1 having columns 5 extending outwardly from an array of precise contact locations 23 on the component. The tops of the columns are in the same surface and each has a metal pad for bonding to a second array of contacts on a second component. Each column is firmly supported by the surrounding photoresist 21, 27, 33, 37 so that the pressure P required to diffusion bond the columns to the second component can be easily applied without distorting the columns, as shown in FIG. 4j.

After the thin deposit 39 has been diffusion bonded to a mating component by known methods such as flip-chip bonding, cold welding, diffusion bonding, or melting, the supporting photoresist 21, 27, 33, 37 remaining between the columns is dissolved out using known photoresist solvents such as acetone. The columns then provide the sole support for one of the components in a manner which permits flexing of the columns to permit differential thermal expansion of the components without rupture, as described earlier.

Although indium plating has been used to illustrate the method of depositing metal, the plating or vapor deposition of indium and other metals such as lead are also within the scope of the invention. Likewise, the columns can have cross-sections other than round and the microelectronic components being connected can be made of any suitable material having electrical contact locations. While the joining of components having flat surfaces appears most practical for most applications, it is clear that the invention can be extended to the joining of any two components having mating surfaces.

Numerous variations and modifications may be made without departing from the present invention. Accordingly, it should be clearly understood that the form of the present invention described above and shown in the accompanying drawings is illustrative only and is not intended to limit the scope of the present invention.

What is claimed is:

1. A method of providing at least one interconnector for microelectronic components, comprising the steps of:
   a. providing a microelectronic component having a surface with a first coat of photoresist and at least one surface uncoated with photoresist;
   b. applying a first deposit of metal on said uncoated surface;
   c. coating said first deposit of metal and said first coat of photoresist with a second coat of photoresist;
   d. removing material from said second coat of photoresist until its top surface is flush with the top surface of said first deposit of metal and until irregularities in the height of said topsurface are removed; and
   e. applying a second deposit of metal on said top surface, whereby at least one supported interconnect is provided on said microelectronic component.

2. The method as claimed in claim 1, wherein said step (b) comprises electroplating a first deposit of metal on said uncoated surface.

3. The method as claimed in claim 1, wherein said metal comprises indium.

4. A method of providing at least one interconnector for microelectronic components, comprising the steps of:
   a. providing a microelectronic component having a surface with a coat of photoresist and at least one surface uncoated with photoresist;
   b. applying a deposit of metal on the uncoated surface;
   c. applying photoresist to the deposit of metal and to the coat of photoresist;
   d. removing the photoresist from the top surface of said deposit of metal;
   e. repeating steps (b), (c), and (d) until a predetermined height of deposited metal is reached;
   f. applying a top deposit of metal on the uncoated surface;
   g. smoothing said top deposit of metal and the surrounding photoresist as required to make their upper surfaces flush and free from surface irregularities, whereby at least one supported interconnect is provided on said microelectronic component.

5. The method as claimed in claim 4, wherein said metal is indium.

6. The method as claimed in claim 4, including after step (g) the step of applying a final deposit of metal on the upper surface of said top deposit of metal.

7. The method as claimed in claim 4, wherein said step (g) comprises:
   applying a top coat of photoresist on said top deposit of metal and on the uppermost coat of photoresist; and
   removing material from said top coat of photoresist and from said top deposit of metal.

8. The method as claimed in claim 4, including after step (g) the steps of:
   applying a further coat of photoresist on said flush upper surfaces;

removing said further coat of photoresist from said top deposit of metal; and applying a final deposit of metal on the upper surface of said top deposit of metal.

9. A method of interconnecting two microelectronic components, comprising the steps of:
   a. providing a first microelectronic component having a surface with a coat of photoresist and at least one surface uncoated with photoresist;
   b. applying a deposit of metal on the uncoated surface;
   c. applying photoresist to the deposit of metal and to the coat of photoresist;
   d. removing the photoresist from the top surface of said deposit of metal;
   e. repeating steps (b), (c), and (d) until a predetermined height of deposited metal is reached;
   f. applying a top deposit of metal on the uncoated surface;
   g. applying a top coat of photoresist on said top deposit of metal and on the uppermost coat of photoresist;
   h. removing material from said top coating of photoresist and from said top deposit of metal until their upper surfaces are flush and free from surface irregularities;
   i. applying a final deposit of metal on the upper surface of said top deposit of metal;
   j. positioning a contact location on a second microelectronic component against said final deposit; and
   k. bonding said contact location of said second microelectronic to said final deposit.

10. The method as claimed in claim 9, including after step (k) the step of removing photoresist from between said microelectronic components.

11. A method of interconnecting a two-dimensional array of sensors, each sensor having an electrical output location, with signal processor means having a two-dimensional array of electrical input locations, comprising:
   a. applying photoresist to the surface of said processor means having said electrical input locations;
   b. removing photoresist from said array of electrical input locations;
   c. applying a deposit of metal on said electrical input locations;
   d. applying photoresist to the deposit of metal and to the applied photoresist;
   e. removing the photoresist from the top surface of said deposit of metal;
   f. applying a deposit of metal on the uncoated surface;
   g. repeating steps (d), (e), and (f), until a predetermined height of deposited metal is reached;
   h. applying a top coat of photoresist on the uppermost deposit of metal and applied photoresist;
   i. removing material from said top coat of photoresist and from said uppermost deposit of metal until their upper surfaces are flush and free from surface irregularities;
   j. applying a final deposit of metal on said uppermost deposit of metal;
   k. positioning said output locations on said sensors against said final deposit; and
   l. bonding said output locations of said sensors to said final deposit.

12. The method as claimed in claim 11, wherein said steps (c) and (f) comprise electroplating said deposit of metal and said step (j) comprises vapor depositing said final deposit of metal.

* * * * *